United States Patent [19]
Holloway

[11] Patent Number: 6,040,249
[45] Date of Patent: Mar. 21, 2000

[54] METHOD OF IMPROVING DIFFUSION BARRIER PROPERTIES OF GATE OXIDES BY APPLYING IONS OR FREE RADICALS OF NITROGEN IN LOW ENERGY

[75] Inventor: Thomas C. Holloway, Murphy, Tex.

[73] Assignee: Texas Instruments Incorporated, Dallas, Tex.

[21] Appl. No.: 08/907,668

[22] Filed: Aug. 8, 1997

[51] Int. Cl.$^7$ .................................................. H01L 21/318
[52] U.S. Cl. ............................................. 438/769; 438/286
[58] Field of Search ..................................... 438/769, 777, 438/775, 766, 776, 786, 792, 305, 286

[56] References Cited

U.S. PATENT DOCUMENTS

| | | | |
|---|---|---|---|
| 4,621,277 | 11/1986 | Ito et al. ..................................... | 357/54 |
| 4,725,560 | 2/1988 | Abernathey et al. . | |
| 4,762,728 | 8/1988 | Keyser et al. ............................. | 427/38 |
| 4,774,197 | 9/1988 | Haddad et al. ............................ | 437/27 |
| 4,776,925 | 10/1988 | Fossum et al. .......................... | 156/653 |
| 5,620,910 | 4/1997 | Teramoto . | |
| 5,629,221 | 5/1997 | Chao et al. ............................... | 438/591 |
| 5,685,949 | 11/1997 | Yashima ................................. | 456/643.1 |
| 5,712,208 | 1/1998 | Tseng et al. ............................. | 438/770 |
| 5,837,598 | 11/1998 | Aronowitz et al. ...................... | 438/532 |
| 5,840,610 | 11/1998 | Gilmer et al. ........................... | 438/301 |
| 5,882,974 | 3/1999 | Gardner et al. . | |
| 5,908,312 | 6/1999 | Cheung et al. .......................... | 438/287 |
| 5,939,763 | 8/1999 | Hao et al. . | |

FOREIGN PATENT DOCUMENTS

H6-151829  5/1994  Japan .

OTHER PUBLICATIONS

Sameer Haddad and Mong–song Liang, Improvement of Thin–Gate Oxide Integrity Using Through–Silicon–Gate Nitrogen Ion Implantation, IEEE Electron Device Letters, vol. 8, No. 2, p 58–60, Feb. 1987.

Patent Abstract of Japan, vol. 096, No. 005, May 31, 1996 & JP 08 023095A (Sanyo Electric Co. LTD), Jan. 23, 1996.

Patent Abstract of Japan, vol. 013, No. 230 (E–764), May 26, 1989 & JP 01 037029A (Matsushita Electric Inc Co. LTD), Feb. 7, 1989.

Hattangady, et al., "Controlled Nitrogen Incorporation at the Gate Oxide Surface", Applied Physics Letters, vol. 66, No. 25, Jun. 19, 1995, pp. 3495–3497 XP 002097617.

"Influence of Nitrogen Content on B Diffusion in $SiO_2$", Spring 1994 Electrochemical Society Meeting, San Francisco, pp. 229–230 (S. Nedelec, D. Mathiot, E. Andrea, M. Gauneau and P. Debenest).

"Quantitive Auger Sputter Depth Profiling of Very Thin Nitrided Oxide", 1990 American Institute of Physics, Oct. 1990, pp. 3635–3642 (K. Barla, D. Nicolas, R. Pantel, B. Vuilermoz, A. Straboni and Y. Carantini).

*Primary Examiner*—Chandra Chaudhari
*Assistant Examiner*—Martin Sulsky
*Attorney, Agent, or Firm*—Jacqueline J. Garner; Wade James Brady III; Richardson L. Donaldson

[57] ABSTRACT

A method of providing a MOSFET having improved gate oxide diffusion barrier properties, which comprises providing a partially fabricated MOSFET having an exposed gate oxide surface. During MOSFET fabrication, the surface of the exposed gate oxide is converted to an oxynitride by applying one or both of ions or free radicals of nitrogen to the exposed gate oxide surface. Fabrication of the MOSFET is then completed in standard manner.

14 Claims, No Drawings

METHOD OF IMPROVING DIFFUSION BARRIER PROPERTIES OF GATE OXIDES BY APPLYING IONS OR FREE RADICALS OF NITROGEN IN LOW ENERGY

BACKGROUND OF THE INVENTION

1. Field of the Invention

This invention relates to a method of improving the diffusion barrier properties of the gate oxide of MOSFET transistors.

2. Brief Description of the Prior Art

The continued reduction in the geometry of MOSFET transistors has resulted in the requirement of continually shorter gate lengths (<0.3 $\mu$m). This geometry reduction has also required a reduction in gate oxide thickness to about 5 nanometers and reduction in operating supply voltage in order to support the minimum gate length without excessively high threshold voltages. Since n-type and p-type polycrystalline silicon (polysilicon) is commonly used as the gate electrode material in MOSFETs and with high gate electrode doping being essential to minimize depletion layer depth in the gate electrode, dopant diffusion from the polysilicon through the gate oxide and into the channel region of the MOSFET becomes an increasing problem with the reduced gate oxide thickness. This problem is particularly critical for the case of a boron-doped polysilicon gate in a p-channel MOSFET having a p-type polysilicon gate electrode.

Attempts to minimize this problem in the fabrication of state-of-the-art MOSFET transistors have generally involved improvement in the diffusion barrier properties of the gate oxide. Prior art methods of providing improved diffusion barrier properties to the gate oxide of MOS transistors have involved the introduction of nitrogen into the ambient during processing when the surface of the gate oxide is exposed in the form of $N_2$ and/or nitrous oxide ($N_2O$). While providing desirable diffusion barrier properties to the gate oxide by forming an oxynitride at the exposed surfaces of the gate oxide, this method also results in reduction of surface carrier mobility since the nitrogen is present at the channel/gate oxide ($Si/SiO_2$) interface.

Attempts have also been made to improve the barrier properties of $SiO_2$ using re-oxidized, nitrided oxide (ROXNOX) and oxides grown using nitrous oxide ambient. In both cases, the heavily nitrided region is near the $Si/SiO_2$ channel interface and degrades carrier mobility. Other methods of incorporating an oxy-nitride region in the gate oxide away from the channel interface, such as oxynitride deposition or conventional ion implantation suffer from the problem that the oxides are so thin, ~10 nm or less, that they require very precise deposition control or very low ion implantation energies. It is therefore apparent that improved procedures are required for the new generations of MOSFETs for formation of the diffusion barrier.

SUMMARY OF THE INVENTION

In accordance with the present invention, there is provided a method of improving the diffusion barrier properties of $SiO_2$, this being accomplished by using a plasma discharge to produce free radicals of nitrogen, the free radicals of nitrogen in the ambient converting the surface of an exposed gate oxide to an oxy-nitride. Furthermore, if the plasma reactor configuration is that normally used for a reactive ion etch (RIE), then very low energy of from about 50 eV to about 1000 eV and preferably about 300 eV is required for ion implantation of nitrogen ions into the surface of the gate oxide to convert the surface of an exposed gate oxide to an oxy-nitride. The procedure involves heating of the wafer with gate oxide thereon to low temperatures of from about 27° C. to about 800° C. with higher temperatures being better for higher nitrogen incorporation into the oxide but 300° C. or less being more compatible with RIE equipment. A preferred tradeoff temperature is about 650° C. The result is containment of the nitrogen to the surface region of the gate oxide. The primary consideration is to prevent the nitrogen from reaching the bottom of the $SiO_2$ gate layer because surface carrier mobilities in the MOSFET will then be degraded. Accordingly, the nitrogen is kept away from the gate oxide/silicon substrate interface by at least one atomic monolayer (~0.3 nanometer). The resulting range of acceptable depths accordingly depends upon the target gate oxide thickness, but for a 4 nanometer gate oxide, the acceptable depth range is from about one atomic layer to about 3.5 nanometers with a preferred peak concentration depth of 1 nanometer from the surface.

Briefly, a MOSFET is partially fabricated in conventional manner up to and including formation of a thin gate oxide over the silicon substrate. The surface of the exposed gate oxide is then treated so that an oxy-nitride surface region is formed.

The oxy-nitride region is formed in accordance with a preferred embodiment by exposing the gate oxide surface to a plasma discharge with nitrogen gas ($N_2$) and/or nitrous oxide ($N_2O$) as the primary gas or gases in the discharge. The N+ free radicals produced from this discharge disassociate the surface $SiO_2$ to form a surface oxynitride.

In addition, in accordance with a second embodiment of the invention, if the plasma reactor is in a reactive ion etch (RIE) configuration where the substrates are on the powered electrode, surface bombardment of the gate oxide with nitrogen ions will occur, resulting in a very low energy ion implantation of the surface of the oxide. The energy of this ion implantation is controlled by the substrate potential with respect to the plasma, which is controlled by reactor power density and gas pressure. Either the nitrogen free radical conversion or ion bombardment or a combination of both can be used to convert the surface of the thin gate oxide to an oxy-nitride which will suppress the diffusion of dopant impurities from the gate electrode. The MOSFET process flow then continues in standard manner to complete fabrication thereof.

DESCRIPTION OF THE PREFERRED EMBODIMENTS

Fabrication of a MOSFET in accordance with the present invention utilizes the standard process flow up to and including formation of the gate oxide but not including gate electrode deposition wherein a silicon substrate or layer with a gate oxide thereon is formed in standard manner by patterning and etching an oxide layer on the silicon substrate. The exposed surface of the gate oxide is then converted to an oxynitride by the use of free radicals only, ions only or a combination of free radicals and ions. This is accomplished in accordance with a first embodiment of the invention by heating the wafer to a temperature of about 650° C. and remotely generating free radicals by microwave plasma in conjunction with a source of $N_2$ gas in the plasma chamber. This is accomplished in accordance with a second embodiment of the invention by heating the wafer to a temperature of about 400° C. and then providing a parallel plate reactor with RF power capacitively coupled to the substrate (i.e., RIE mode) with an N$_2$ gas source present. The N$_2$ gas pressure and RF power are set to obtain about a −300 volt DC substrate electrode bias to provide nitrogen ion bombardment of the exposed oxide layer. A combination of the first and second embodiment can be provided concurrently as a third embodiment. The gate electrode deposition with oxynitride formation on the surface thereof is followed by the remaining standard MOSFET process flow to complete the device fabrication.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method of providing a MOSFET having improved gate oxide diffusion barrier properties, comprising the steps of:

(a) providing a partially fabricated MOSFET having an exposed gate oxide surface;

(b) converting the surface of said exposed gate oxide to an oxynitride by a very low energy implant of nitrogen into said exposed gate oxide surface wherein said low energy is from about 50 eV to about 1000 eV; and (c) completing fabrication of said MOSFET.

2. The method of claim 1 wherein said low energy implant is an implant provided by the techniques of reactive ion etching.

3. A method of fabricating a gate oxide for a MOSFET having a diffusion barrier thereon, comprising the steps of:

(a) providing a partially fabricated MOSFET semiconductor device having a layer of semiconductor material and an exposed gate oxide on said layer of semiconductor material forming an interface with said semiconductor layer; and (b) subjecting said exposed surface to at least one of free radicals or ions of nitrogen to form an oxynitride region at the exposed surface of said gate oxide by low energy ion implantation of from about 50 eV to about 1000 eV.

4. The method of claim 3 wherein said oxynitride is spaced from said interface by at least one atomic monolayer.

5. The method of claim 3 wherein said exposed surface is subjected to free radicals by the step of heating said partially fabricated MOSFET semiconductor device to a temperature in the range of from about 27° C. to about 800° C. and the steps of generating and applying said free radicals to said exposed gate oxide by providing nitrogen gas in a microwave plasma.

6. The method of claim 5 wherein said temperature is about 650° C.

7. The method of claim 3 wherein the depth of said oxynitride region is from about one atomic monolayer to about 90 percent of the distance from the exposed surface of the oxynitride layer to said interface.

8. The method of claim 5 wherein the depth of said oxynitride region is from about one atomic monolayer to about 90 percent of the distance from the exposed surface of the oxynitride layer to said interface.

9. The method of claim 6 wherein the depth of said oxynitride region is from about one atomic monolayer to about 90 percent of the distance from the exposed surface of the oxynitride layer to said interface.

10. The method of claim 3 wherein said exposed surface is subjected to ions by the steps of heating said partially fabricated MOSFET semiconductor device to a temperature of about 400° C., providing a parallel plate reactor with RF power capacitively coupled to said heated partially fabricated MOSFET semiconductor device in the presence of N$_2$ gas and causing said reactor to provide said ions.

11. The method of claim 10 wherein the pressure of said N$_2$ gas and RF power are set to obtain about a −300 volt DC bias at said device to provide nitrogen ion bombardment of the exposed oxide layer.

12. The method of claim 3 wherein said exposed surface is subjected to both of free radicals or ions of nitrogen to form an oxynitride region at the exposed surface of said gate oxide.

13. The method of claim 12 wherein said exposed surface is subjected to ions by the steps of heating said partially fabricated MOSFET semiconductor device to a temperature of about 400° C., providing a parallel plate reactor with RF power capacitively coupled to said heated partially fabricated MOSFET semiconductor device in the presence of N$_2$ gas and causing said reactor to provide said ions and said exposed surface is subjected to free radicals by the step of heating said partially fabricated MOSFET semiconductor device to a temperature in the range of from about 27° C. to about 800° C. and generating and applying to said exposed gate oxide said free radicals by providing nitrogen gas in a microwave plasma.

14. The method of claim 3 wherein said oxynitride is formed by applying free radicals of nitrogen to said surface.

* * * * *

UNITED STATES PATENT AND TRADEMARK OFFICE
CERTIFICATE OF CORRECTION

PATENT NO. : 6,040,249
DATED : March 21, 2000
INVENTOR(S) : Thomas C. Holloway

It is certified that error appears in the above-identified patent and that said Letters Patent is hereby corrected as shown below:

On the title page, insert the following item:
 --[60] Provisional application No. 60/023,752, August 12, 1996.

Column 1, line 4, insert the following:
 --CROSS REFERENCE TO RELATED APPLICATION
Reference is made to and priority claimed from U.S. Provisional Application Serial No. 60/023,752, filed August 12, 1996, entitled Method of Improving the Diffusion Barrier Properties of Gate Oxides. --

Signed and Sealed this

Second Day of January, 2001

Attest:

Q. TODD DICKINSON

*Attesting Officer*  *Commissioner of Patents and Trademarks*